US011796586B2

United States Patent
Van Rossum

(10) Patent No.: US 11,796,586 B2
(45) Date of Patent: Oct. 24, 2023

(54) POWER CABLE

(71) Applicant: Prysmian S.p.A., Milan (IT)

(72) Inventor: Jos Van Rossum, Bodegraven (NL)

(73) Assignee: Prysmian S.p.A, Milan (IT)

( * ) Notice: Subject to any disclaimer, the term of this patent is extended or adjusted under 35 U.S.C. 154(b) by 0 days.

(21) Appl. No.: 17/715,126

(22) Filed: Apr. 7, 2022

(65) Prior Publication Data

US 2022/0334166 A1    Oct. 20, 2022

(30) Foreign Application Priority Data

Apr. 14, 2021   (IT) .................. 102021000009344

(51) Int. Cl.
| | | |
|---|---|---|
| G01R 31/12 | (2020.01) | |
| G01R 31/58 | (2020.01) | |
| G01R 31/08 | (2020.01) | |
| H01B 7/02 | (2006.01) | |

(52) U.S. Cl.
CPC ....... G01R 31/1272 (2013.01); G01R 31/085 (2013.01); G01R 31/58 (2020.01); H01B 7/0216 (2013.01)

(58) Field of Classification Search
CPC .. G01R 31/1272; G01R 31/085; G01R 31/58; H01B 7/0216; H01B 7/1875; H01B 9/027; H01B 7/32
See application file for complete search history.

(56) References Cited

U.S. PATENT DOCUMENTS

2005/0218905 A1* 10/2005 Prunk ................ G01R 31/1272
                                                               324/544
2013/0168126 A1*  7/2013 Kuchta .................. H01B 7/361
                                                               174/102 SC

FOREIGN PATENT DOCUMENTS

| CN | 206893338 U | 1/2018 |
|---|---|---|
| EP | 0398593 A2 | 11/1990 |
| EP | 2577683 B1 | 1/2018 |
| FR | 3048812 A1 | 9/2017 |
| WO | WO03/046592 A1 | 6/2003 |

OTHER PUBLICATIONS

Alberti, Michele; Research Report on Italian Patent Application No. IT202100009344; dated Dec. 13, 2021; 2 pages.

* cited by examiner

*Primary Examiner* — Feba Pothen
(74) *Attorney, Agent, or Firm* — Frost Brown Todd LLP

(57) ABSTRACT

A power cable includes a cable core, a jacket and an outermost semiconductor layer. The cable core includes at least one conductor, an insulating system thereof, and at least one metallic screen. The jacket surrounds the cable core and includes an inner jacket layer and an outer jacket layer. The outermost semiconducting layer surrounds the outer jacket layer in direct contact thereto. The power cable further includes a test semiconducting layer radially external to the inner jacket layer, radially internal to the outer jacket layer, and directly contacting them. A power cable system, and a jacket integrity testing method for a power cable, are also provided.

12 Claims, 6 Drawing Sheets

POWER CABLE

TECHNICAL FIELD

The present disclosure relates to a power cable for electric power transmission or distribution. The power cable may additionally comprise optical fiber(s). The present disclosure further relates to a power cable system, a manufacturing method for a power cable, and a jacket integrity testing method for a power cable.

BACKGROUND

A power cable usually comprises a cable core and a jacket (sometimes also named oversheath) radially outer to the cable core, the cable core including at least one insulated conductor (namely, a conductor and an insulating system thereon) and at least one metallic screen.

The main function of the jacket is that of environmental protection, namely to protect the underlying cable core from mechanical damage which may be caused e.g. by tools, rocks, etc., during transportation and installation, as well as during service in case e.g. of excavation works. Should the jacket be defected and/or damaged, so that a discontinuity exists in the jacket material, then current leakage may occur from the conductor(s) to ground or earth, through the defected and/or damaged jacket, entailing an undesired power loss besides possible other inconveniences. For example, the presence of a cut in the jacket represents a preferential route for the entry of water or moisture to the interior of the cable (that is to say towards the core), entailing e.g. metallic screen corrosion problems and premature ageing with degradation of the electrical properties of the insulating material (sometimes referred to as "water treeing").

In order to check the structural integrity of the jacket, a so-called "DC voltage test of the oversheath" (hereinbelow also referred to as "jacket integrity test") is usually used, which consists in providing an outermost layer of semiconducting material, radially outer to the jacket, and applying a DC voltage across the metallic screen and the outermost semiconducting layer at a first location along a power cable and in particular at a first end thereof, for example at a cable termination or at a joint between cables.

In the absence of defects and/or damages, the jacket may withstand the applied voltage. This may result, for example, in no variation of the applied DC testing voltage during test or a decrease of the charging current during the DC test down to a stable zero (with no increases).

If, however, the jacket has a defect and/or damage such as to create an electrically conductive path in the thickness of the jacket between the electrodes in the test, a too high charging current is generated between the electrodes (e.g. outermost semiconducting layer and the metallic screen) so that it is not possible to apply the DC testing voltage; or the DC testing voltage can be reached but the charging current is not decreasing to zero.

The DC voltage test of the oversheath can be performed directly at the production plant on every single cable length manufactured. Also, the DC voltage test of the oversheath may be repeated once the cable reaches the installation site (when still on drum to check any transportation damage and/or after the cable has been pulled and laid in its final position) and/or on the entire cable system (thus including all individual cable lengths and accessories) both before the first use and after predetermined time span as part of a circuit maintenance plan.

Further particulars about the DC voltage test of the oversheath and its application as maintenance test are set forth in, respectively IEC 60229 (October 2007) and Cigre TB 797 (2020).

An example of power cable suitable for this test is discussed in EP2577683B1.

FR3048812 discloses an electric cable comprising an insulated conductor, a first protecting sheath and a second protecting sheath. Both the first and the second protective sheaths can be made of two layers each. The layers of the first protecting sheath are made of a thermoplastic material. The layers of the first and of the second protecting sheath can contain carbon black. In particular, the carbon black can be present in an amount of from 1 wt % to 50 wt % or more.

SUMMARY

In accordance with one embodiment, a power cable includes a cable core, a jacket and an outermost semiconductor layer. The cable core includes at least one conductor, an insulating system thereof, and at least one metallic screen. The jacket surrounds the cable core and includes an inner jacket layer and an outer jacket layer. The outermost semiconducting layer surrounds the outer jacket layer in direct contact thereto. The power cable further includes a test semiconducting layer radially external to the inner jacket layer, radially internal to the outer jacket layer, and directly contacting them.

In accordance with other embodiments, a power cable system includes at least one power cable according to the above, and a method for jacket integrity testing of a power cable system includes at least one power cable according to the above.

BRIEF DESCRIPTION OF DRAWINGS

Further features and advantages of the present disclosure will be more clearly apparent from the following detailed disclosure of some embodiments thereof, made with reference to the attached drawings, wherein.

DETAILED DESCRIPTION OF EMBODIMENTS

Figure 1:
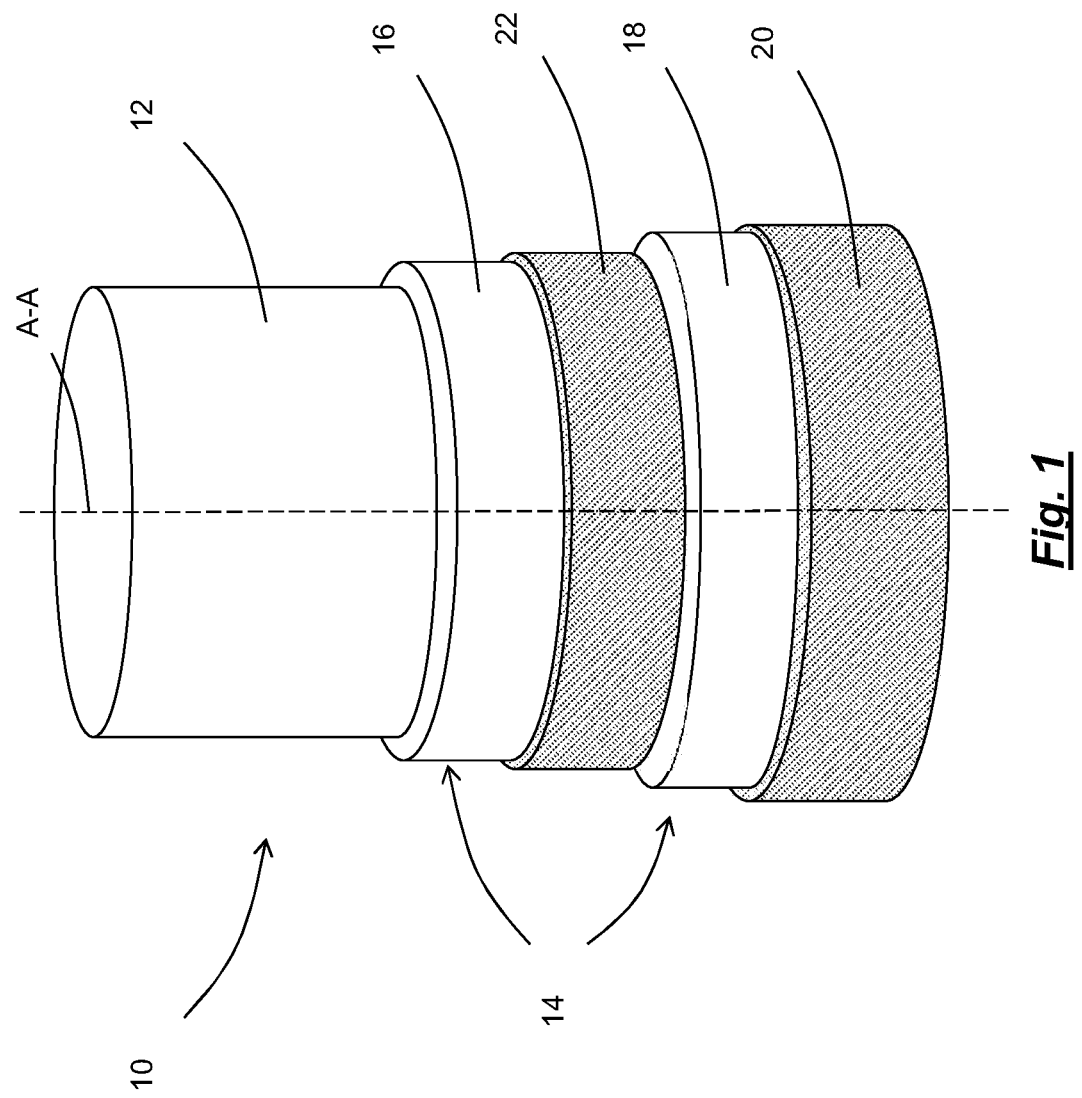
FIG. 1 diagrammatically shows a power cable according to the present disclosure.

While conventional jacket integrity tests may be well suited for testing a power cable after manufacture, they pose some problems for testing a power cable after installation and notably during the service life of the cable.

Indeed, an installed cable usually has its metallic screen earthed or grounded. In order to carry out the jacket integrity test, the cable system has thus to be taken off-line, the conductor core(s) need(s) to be grounded, and the connection of the metallic screen has to be disconnected, and restored after the test—if the test is passed. These operations are costly, time-consuming, and may also involve safety risks; furthermore, after the test, there is a risk of incorrect metallic screen bonding. Of course, a continuous monitoring of the outer jacket integrity is not possible while the cable is energized, unless using advanced electronic systems for detecting and analyzing the metallic screen circulating currents.

There is a need, accordingly, for an improvement in jacket integrity testing of power cables.

The Applicant has perceived that the above-mentioned drawbacks may be avoided by providing an additional semiconducting layer radially outer with respect to the cable core including the metallic screen(s). This allows performing an improved DC withstanding test by applying the testing voltage across the two semiconducting layers.

The cable and the testing method according to the present disclosure do not need the metallic screen to be disconnected, and the cable may even be tested while energized.

Furthermore, any splicing device, for example a braid made of copper, for connecting the two semiconducting layers with the testing apparatus, may remain connected to the power cable while energized, further simplifying the testing procedure.

Even, the testing apparatus itself may remain connected to the power cable while energized, in case periodically checking of the jacket integrity is desired, by taking the due safety measures.

In an aspect, the present disclosure relates to a power cable comprising:
- a cable core, comprising at least one conductor, an insulating system thereof, and at least one metallic screen,
- a jacket surrounding the cable core, comprising an inner jacket layer and an outer jacket layer, and
- an outermost semiconducting layer surrounding the outer jacket layer and in direct contact thereto,
- characterized by further comprising a test semiconducting layer radially external to the inner jacket layer, and radially internal to the outer jacket layer and directly contacting them.

In this way, the cable comprises, moving radially outwards from a cable centerline or longitudinal axis A-A, the cable core, a first (inner) jacket layer, a first (test) semiconducting layer, a second (outer) jacket layer and a second (outermost) semiconducting layer.

The jacket layers are not electrically conducting. The inner jacket layer further plays the role of an insulator between the metallic screen and the test semiconducting layer.

The outermost semiconducting layer may be coextruded with the outer jacket layer over the underlying test semiconducting layer. Coextrusion has the benefit that the outermost semiconducting layer does not buckle due to friction or sidewall bearing forces during installation. The outermost semiconducting layer may also provide sunlight resistance.

Alternatively or additionally, the test semiconducting layer may be coextruded with the inner jacket layer. Coextrusion has, similarly, the benefit that the test semiconducting layer does not buckle due to friction or sidewall bearing forces during installation.

The inner and the outer jacket layer may have any suitable thickness; for example, their thicknesses may range between 0.2 and 5.0 mm. For example, their thickness may be 2.2 mm.

The test semiconducting layer may have any suitable thickness; for example, its thickness may range between 0.3 and 1.0 mm, and for example it is about 0.5 mm.

The outermost semiconducting layer may have any suitable thickness; for example, its thickness may range between 0.3 and 1.0 mm, and for example it is about 0.5 mm.

The inner and outer jacket layers may have substantially the same or different thickness. In the first case, the test semiconducting layer is equally spaced from the metallic screen and from the outermost semiconducting layer.

The Applicant found that when the test semiconducting layer is substantially equally spaced from the metallic screen and the outermost semiconducting layer, namely when the inner and outer jacket layers have substantially the same thickness, then the power cable may easily be manufactured starting from the cable core, by a dual passage in one and the same extruder (while changing the extrusion head).

Each of the test semiconducting layer and the outermost semiconducting layer may have any suitable electrical resistivity, for example a resistivity value less than 10 Ohm·m, for example they may have a resistivity value equal to 0.7 Ohm·m or even as low as 0.1 Ohm·m.

Test semiconducting layer and/or the outermost semiconducting layer may be of a different color than the adjacent jacket layer(s).

The power cable may be configured for use in any voltage range, in particular it may be a low voltage (LV) cable, which usually means voltages up to 1 kV; a medium voltage (MV) cable, which usually means voltages in the range from 1 kV to 30-36 kV; a high voltage (HV) cable, which usually means voltages in the range between 30-36 and 170 kV; or an extra high voltage (EHV) cable, which usually means voltages higher than 170 kV.

The power cable may be a unipolar cable, including a single cable core.

The power cable may be a multipolar cable, including two insulated conductors (bipolar cable), three insulated conductors (tripolar cable) or more than three insulated conductors. In a multipolar cable, the insulated conductors may be stranded together, such as by means of a helical winding of a predetermined pitch.

In the case of multipolar cables, the metallic screen may be a single shared metallic screen or there may be one metallic screen for each conductor, or there may be both one metallic screen for each conductor and a shared metallic screen.

The power cable of the present disclosure may further comprise one or optical fibers for sensing and/or telecommunication purposes.

The insulating system of the single or each conductor may include, besides an insulating layer, additional layers such as a core inner semiconducting layer arranged radially between the conductor and the insulating layer and in direct contact thereto, and/or a core outer semiconducting layer surrounding and directly contacting the insulating layer and in electric contact with the metallic screen In another aspect, the present disclosure relates to a power cable system comprising at least one power cable as discussed above, and bonding leads at either or both ends of said power cable configured for electrically connecting the test semiconducting layer and the outermost semiconducting layer to a jacket integrity testing apparatus. For example, the cable joints can be modified to create a connection point for the test semiconducting layer.

The power cable system may further comprise a monitoring apparatus connected across the test semiconducting layer and the outermost semiconducting layer of said power cable at a first longitudinal end thereof while the cable is energized. This provision allows a continuous monitoring of the jacket integrity while the power cable is in use.

Alternatively or additionally, the power cable system may further comprise a jacket integrity testing apparatus according to the disclosure connected to said power cable, which may remain also while the power cable system is energized.

The jacket integrity testing apparatus according to the present disclosure comprises a voltage source connected across the test semiconducting layer and the outermost semiconducting layer of the power cable at a first longitudinal end thereof, and an ammeter, for example a milliammeter, connected across the test semiconducting layer and the outermost semiconducting layer of the power cable.

In another aspect, the present disclosure relates to a method for jacket integrity testing of a power cable system comprising at least one power cable as discussed above, the method comprising:

applying a testing DC voltage of a preset magnitude across the test semiconducting layer and the outermost semiconducting layer of said power cable at a first longitudinal end thereof, measuring a current flowing across the test semiconducting layer and the outermost semiconducting layer at the first longitudinal end, and detecting, from the measured current, the presence of a fault in the cable outer jacket layer.

The method may further comprise estimating a distance between the fault and the first longitudinal end.

The method may further comprise measuring a second current flowing across the test semiconducting layer and the outermost semiconducting layer at a second longitudinal end opposite the first longitudinal end, and detecting, from the measured second current, the presence of a fault in the cable outer jacket layer.

The method may further comprise estimating, from the second measured current, a distance of a fault in the cable outer jacket layer from the second longitudinal end.

The testing voltage is, for example, of 10 kV DC and is applied for 1 minute.

In the present description and in the attached claims:
- term "radial" means a direction extending perpendicular to a reference longitudinal axis or centerline of the cable,
- expressions "radially inner", "radially innermost", "radially outer" and "radially outermost" refer to relative or absolute positions taken along a radial direction with respect to the reference longitudinal axis or centerline of the cable, inner/innermost meaning closer to the reference longitudinal axis or centerline, and outer/outermost meaning farther away from the reference longitudinal axis or centerline;
- term "surround" and its derivatives mean "in a radially external position with respect to", without implying any concentricity and without necessarily implying direct contact,
- term "underlying" and its derivatives mean "in a radially internal position with respect to", without implying any concentricity and without necessarily implying direct contact,
- terms "in direct contact", "directly contacting" and their derivatives mean without the interposition of any component,
- term "thickness" indicates an average size along a radial direction,
- terms "conductive", "insulated", "connected", "coupled" and other terms are used in the electrical meaning, unless otherwise specified,
- term "conducting" means made of a material having an electrical resistivity lower than $10 \times 10^{-8}$ Ohm·m,
- term "semiconducting" means made of a material having an electrical resistivity comprised between 0.1 and 10 Ohm·m,
- term "insulating" means made of a material having a volume resistivity of at least $1 \times 10^{13}$ ohm·cm.

In the present description and in the following claims, all of the numerical magnitudes indicating amounts, quantities, percentages, and similar shall be deemed to be modified by term "about", unless otherwise indicated, and each range for which a lower and upper limit(s) are given shall be deemed to include all of the possible combinations of those limits, limits included and/or excluded, and all of the possible intermediate ranges, besides those specifically indicated.

In the present description and in the following claims, expression "either" should be construed as encompassing both "the one and the other of two" and "the one or the other of two".

For the purpose of the present description and of the appended claims, the words "a" or "an" should be read to include one or at least one and the singular also includes the plural unless it is obvious that it is meant otherwise. This is done merely for convenience and to give a general sense of the disclosure.

In FIG. 1 there is shown, schematically and only by way of an example, a power cable 10. Some layers of power cable 10 are shown with dashed filling and others are shown with blank filling only for the sake of better distinguishing the various layers.

The power cable 10 may be an AC cable or a DC cable.

The power cable 10 may be a cable for land application—including underground and aerial application—or a cable for submarine application.

The power cable 10 may be a HV or MV power cable, or also a EHV or LV power cable.

Power cable 10 comprises a cable core 12. As will be further discussed with reference to FIGS. 2-5, the cable core 12 includes at least one insulated conductor (namely, a conductor and an insulating system surrounding it) and at least one a metallic screen for electrically shielding the conductor(s). The cable core 12 may also include at least one optical fibre for sensing, and/or for data transmission.

Power cable 10 further includes a jacket 14 surrounding the cable core 12, which comprises an inner jacket layer 16, and an outer jacket layer 20; an outermost semiconducting layer 20, surrounding the jacket 14 and in particular surrounding the outer jacket layer 18, and directly contacting the outer jacket layer 18; and a test semiconducting layer 22 sandwiched within the two jacket layers 16, 18 and in direct contact thereto. The test semiconducting layer 22 is radially external to the inner jacket layer 16, and radially internal to the outer jacket layer 18.

As discussed in the introductory portion of this disclosure, the jacket 14 is not electrically conducting and has the function of environmental protection of the cable core 12. The inner jacket layer 16 further plays the role of an insulator between the metallic screen of cable core 12, and the test semiconducting layer 22.

The test semiconducting layer 22 and the outermost semiconducting layer 20 have the main function of allowing the integrity of the outer jacket layer 18 to be tested. However, the outermost semiconducting layer 20 may also have the function of UV protection of the jacket 14.

The test semiconducting layer 22 is made of a semiconducting polymeric material extruded over or coextruded with the inner jacket layer 16 over the cable core 12.

The outermost semiconducting layer 20 is made of a semiconducting polymeric material extruded over or coextruded with the outer jacket layer 18 over the test semiconducting layer 22.

The test semiconducting layer 22 may be of a different color than the inner jacket layer 16 and outer jacket layer 18; and/or the outermost semiconducting layer 20 may be of a different color than the outer jacket layer 18, so as to visually distinguish them (in order, i.a., to avoid inadvertent damage to the jacket 14 when a cable end is peeled off for splicing or terminating purposes).

The thickness of the inner jacket layer 16 and the thickness of the outer jacket layer 18 may be essentially the same. The test semiconducting layer 22 may be, thus, equally spaced from the cable core 12, in particular to a metallic screen(s) which may be its outermost portion, and from the outermost semiconducting layer 20.

Alternatively, the inner jacket layer 16 might be thinner than the outer jacket layer 18, for example the ratio of thickness of the inner jacket layer 16 to the thickness of the outer jacket layer 18 may range between 1:5 and 2:3.

Ranges of thicknesses of for each of layers 16-22 have been discussed in the above summary.

Each of the test semiconducting layer 22 and the outermost semiconducting layer 20 may have a resistivity value less than 10 Ohm·m, for example they may have a resistivity value equal to 0.7 Ohm·m or even as low as 0.1 Ohm·m.

Each of the inner and outer jacket layers 16, 18 and the outermost and test semiconducting layer 20, 22 may be made of a material based on any polymeric material known to those skilled in the art for cable jackets. Each of these layers 16, 18, 20, 22 may be made, for example, of low density polyethylene (LDPE), medium density polyethylene (MDPE), high density polyethylene (HDPE), polyvinyl chloride (PVC), or a low smoke zero halogen (LSOH) polymer. These layers 16, 18, 20, 22 may be made of a same material or of different materials.

In the case of the outermost and test semiconducting layer 20, 22 the above listed polymer materials are added with a semiconducting filler, for example, a conductive carbon black such as acetylene black or furnace black. The amount of carbon black may range from 1 to 10 wt %, for example ranging from 2 to 5 wt %, relative to the weight of the polymer.

Alternatively, the outermost semiconducting layer 20 may be made of graphite.

In an embodiment, the test inner semiconducting layer 22 and/or the outermost semiconducting layer 20 may be made of a material based on a polymer semiconductive per se, such as polyaniline, polypyrrole and polyacetylene.

As mentioned, either of the test semiconducting layer 22 and the outermost semiconducting layer 20 may be of a different color than the adjacent jacket layer(s) 16, 18. For example, the test semiconducting layer 22 and/or the outermost semiconducting layer 20 may include conductive polymer material such as polyaniline, which provides a non-black color (green, white, clear, blue, or violet) when extruded, depending on its conductivity. Other examples of potential conductive materials for those layers, that result in a non-black extruded polymer, are the above mentioned polypyrrole and polyacetylene. Alternatively, either jacket layer 16, 18 may be formed of a non-black polymer material.

As mentioned, the outermost semiconducting layer 20 may also provide sunlight resistance for the cable. To this end, for example, UV additives can be included in the polymer for this layer.

The test semiconducting layer 22 and the outermost semiconducting layer 20 may be made of a same material or of different materials.

Figure 2:
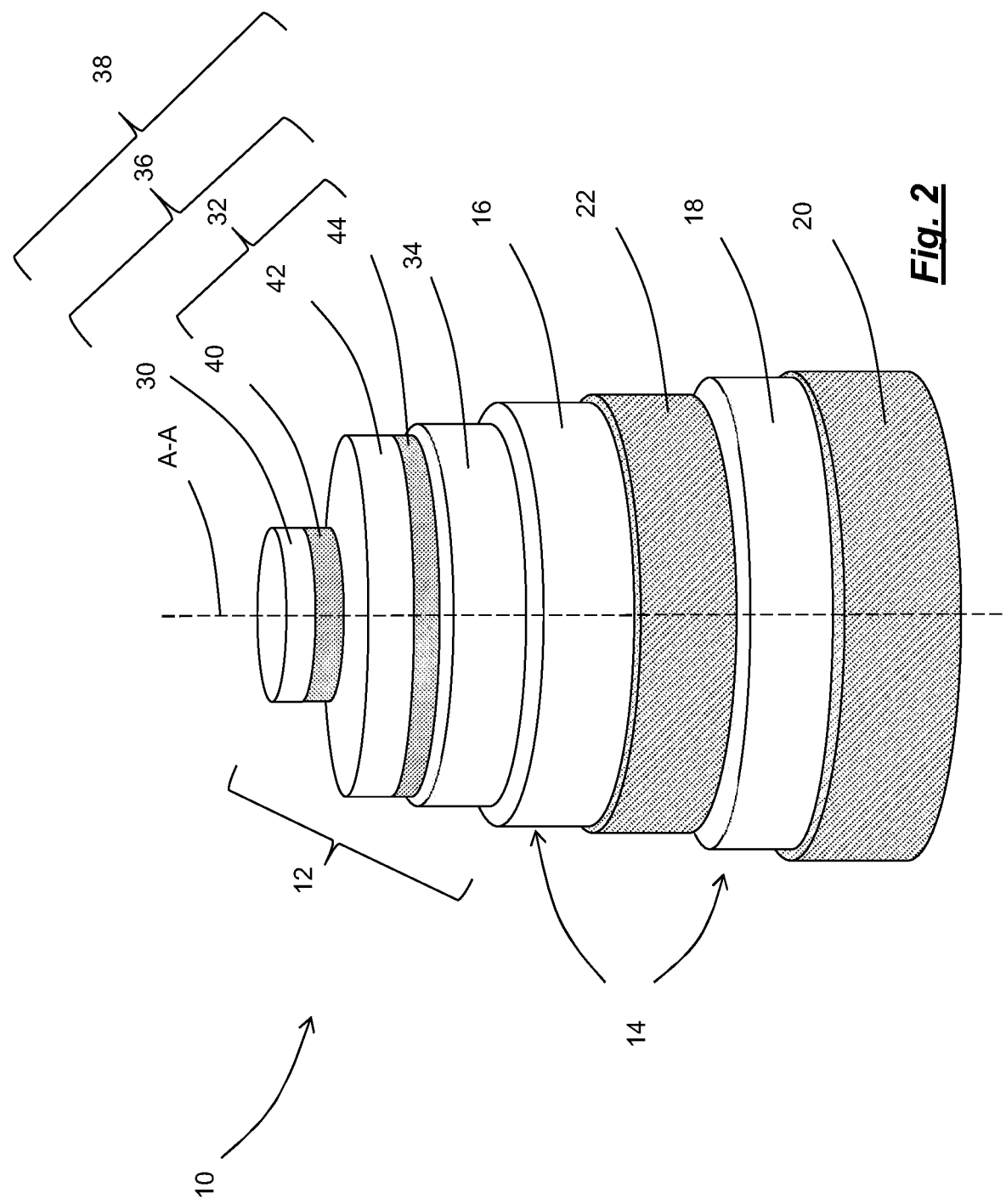
FIGS. 2-4 diagrammatically show examples of a power cable according to the present disclosure.
Figure 3:
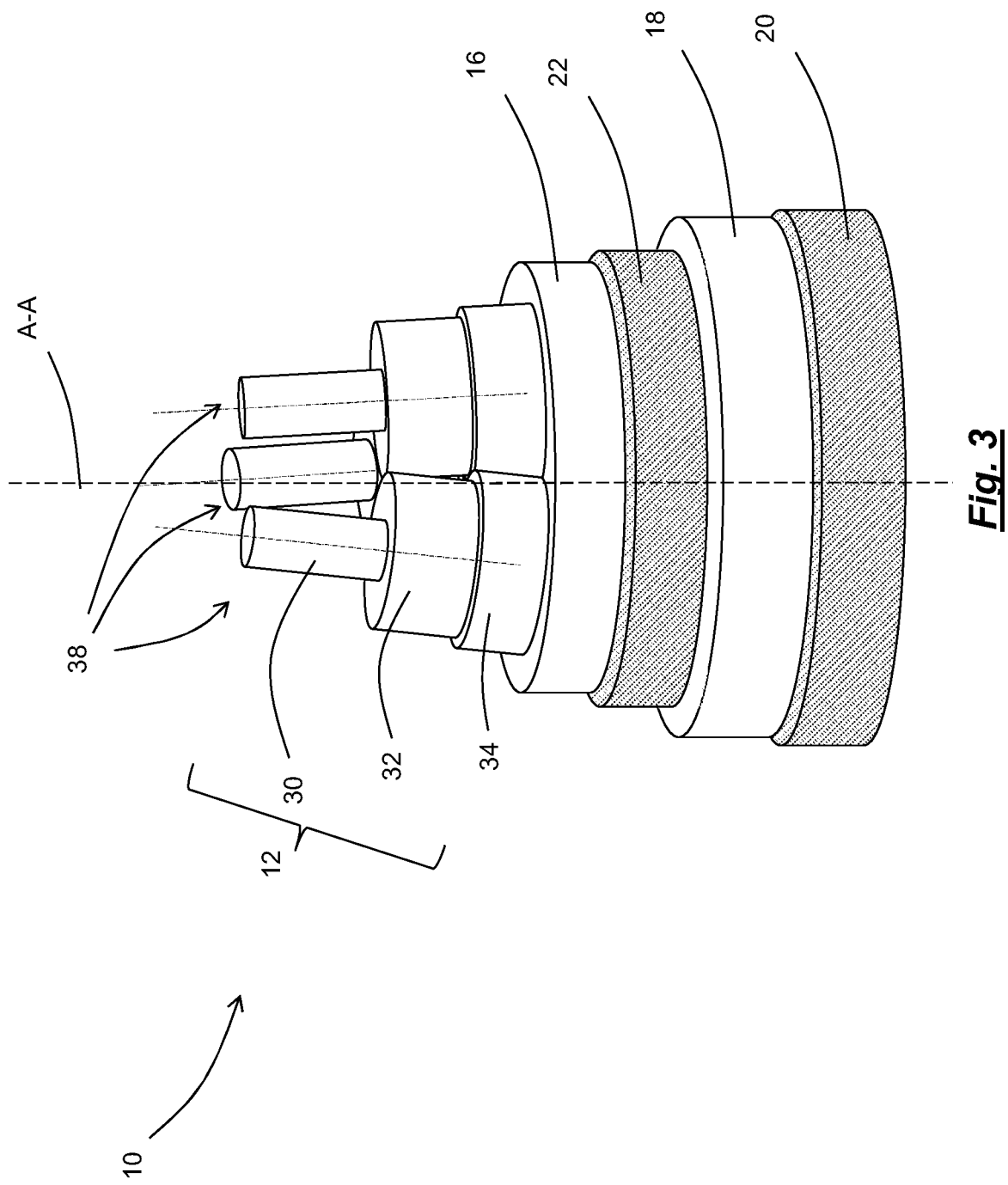
Figure 4:
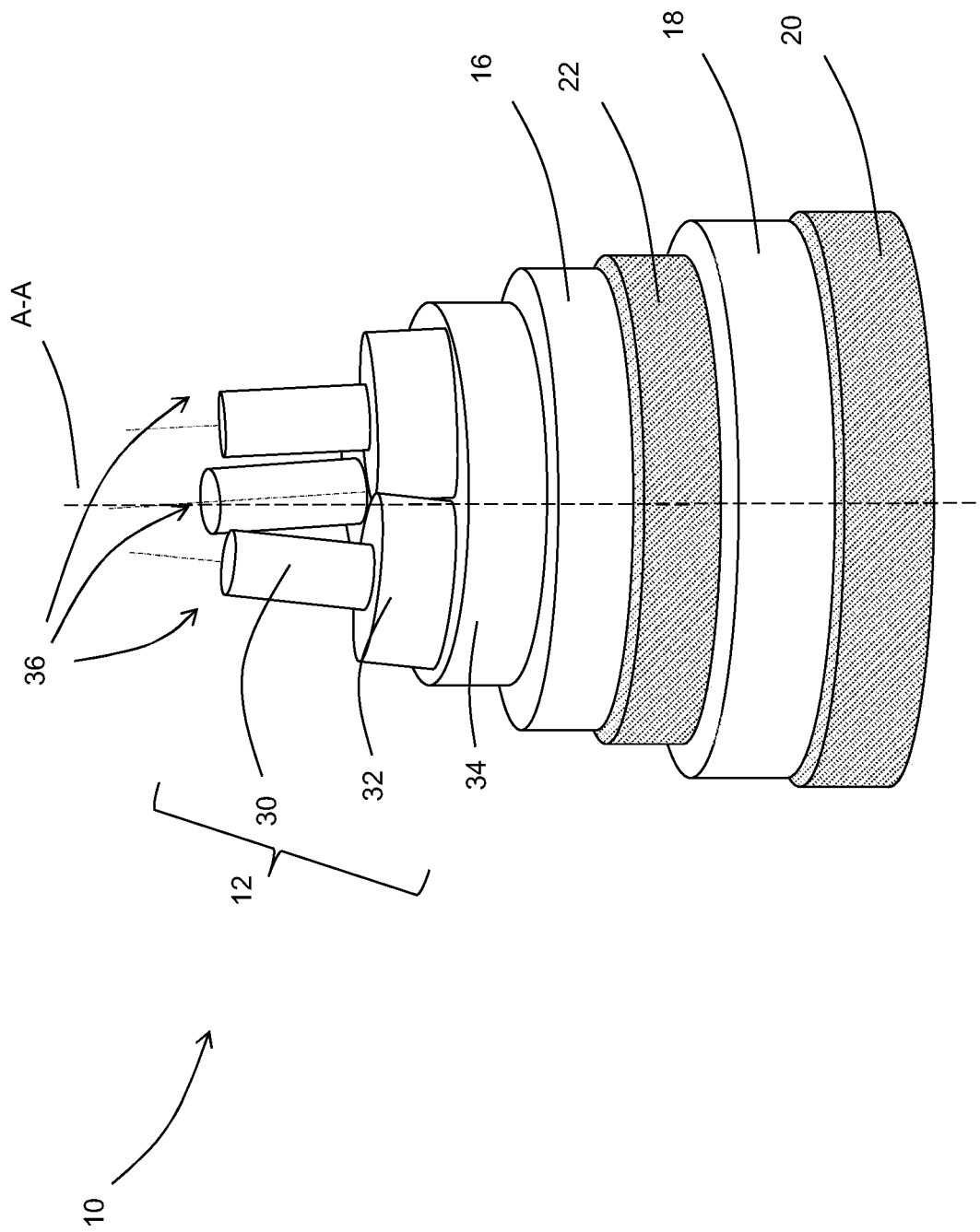

FIGS. 2-4 show cables according to the present disclosure in further detail.

The power cable 10 of FIG. 2 is a unipolar cable, wherein the cable core 12 comprises, moving radially outwards from longitudinal axis A-A:
  a single conductor 30,
  an insulating system 32, surrounding the conductor 30, and
  a metallic screen 34, surrounding the insulating system 32.

The conductor 30 and its insulating system 32 form an insulated conductor 36. The insulated conductor 36 and the metallic screen 34 form a screened insulated conductor 38.

The conductor 30 may be made of copper, aluminum, alloys thereof and composites thereof. It may be in form of a single rod or of stranded wires.

The insulating system 32 comprises, moving radially outwards from longitudinal axis A-A:
  a core inner semiconducting layer 40 surrounding the conductor 30,
  an insulating layer 42 surrounding the core inner semiconducting layer 40, and
  a core outer semiconducting layer 44 surrounding the insulating layer 42.

Each of the layers 40, 42, 44 of the insulating system 32 may be made of a polymer material selected from polyethylene, polypropylene or copolymers thereof. In an embodiment, the three layers of the insulating system 32 are made of the same polymeric material, the two core semiconducting layers differing from the insulating one in that they contain a conductive polymer such as carbon black. The cable core insulating layer 42 may include additives to enhance the life of the insulation, for example tree retardant additives to inhibit the growth of water trees.

The metallic screen 34 may have any configuration known to those skilled in the art. The metallic screen may be a conductive metallic sheet folded on itself and welded or sealed to form a tubular component, or it may be a helically wound tape or wire.

The metallic screen 34 may be made, for example, of copper, aluminum, alloys thereof and composites thereof.

The power cable 10 of FIG. 3 is a tripolar cable as an example of multipolar cable, wherein the cable core 12 comprises three screened insulated conductors 38, namely the cable core comprises three metallic screens 34, each one surrounding a respective conductor 30.

The three screened insulated conductors 38 are stranded together.

The above discussed characteristics, options and variations regarding the single screened insulated conductor 38 of cable core 12 of FIG. 2 apply to each screened insulated conductor 38 of cable core of FIG. 3, mutatis mutandis.

In the present case, though not illustrated, the metallic screens 34 could be in form of at least one rod provided in each interstice between two insulated conductors 38. The rods of the metallic screens 34 may be embedded in a semiconductive filler having a substantially triangular cross-section.

In the present case, the inner jacket layer 16 encircles the three metallic screens 34. In the case of metallic screens 34 in form of at least one rod, the inner jacket layer 16 may encircle and directly contact the semiconductive fillers embedding it/them.

The power cable 10 of FIG. 4 is another tripolar cable as an example of multipolar cable, wherein the cable core 12 comprises three insulated conductors 36 and a single shared metallic screen 34 surrounding them.

The above discussed characteristics, options and variations regarding the single insulated conductor 36 of cable core 12 of FIG. 2 apply to each insulated conductor 36 of cable core of FIG. 4, mutatis mutandis.

In summary, as exemplarily shown in FIGS. 2-4, in the case of multipolar cables, the metallic screen may be a single metallic screen collectively surrounding all the insulated conductors or there may be one metallic screen for each conductor.

Furthermore, in the cable core 12 of a multipolar cable, such as in the cable core 12 of each of the cables 10 shown in FIGS. 3-4, there may be a filler material for imparting a circular cross section to the cable core 12. The filler material will be contained within the shared metallic screen 34, if provided for.

Jacket Integrity Testing

Turning back to the discussion of the components surrounding the cable core 12, and notably as far as integrity jacket testing is concerned, FIG. 1 will be referenced again; for simplicity, when components of the core cable 12 are referred to, the unipolar cable of FIG. 2 will be referred to, unless otherwise indicated. It will however be understood by those skilled in the art that the description below applies equally to any configuration of a unipolar cable, as well as to a multipolar cable.

As mentioned in the background art section of the present disclosure, a conventional method for jacket integrity test of a conventional power cable including a jacket and an outermost semiconducting layer, but lacking any test semiconducting layer (cf. layer 22 of power cable 10), involves the metallic screen(s) of the cable core (cf. metallic screen 34). For example, according to the standard IEC 60229:2007, a DC voltage of 10 kV is applied for a period of 1 min across the metallic screen (cf. metallic screen 34) and the outer semiconducting layer (cf. layer 20); no breakdown between the metallic screen and the outer semiconducting layer should occur during the test. When the test has to be carried out on a cable in use (energized), said operations entail the need of putting the cable off service, disconnecting the metallic screen(s) of the cable core from earth/ground, and reconnecting it/them after a successful test.

As mentioned, the test semiconducting layer 22 of power cable 10 according to the present disclosure obviates these needs, easing the jacket integrity test, especially of a power cable already in operation.

Figure 5:
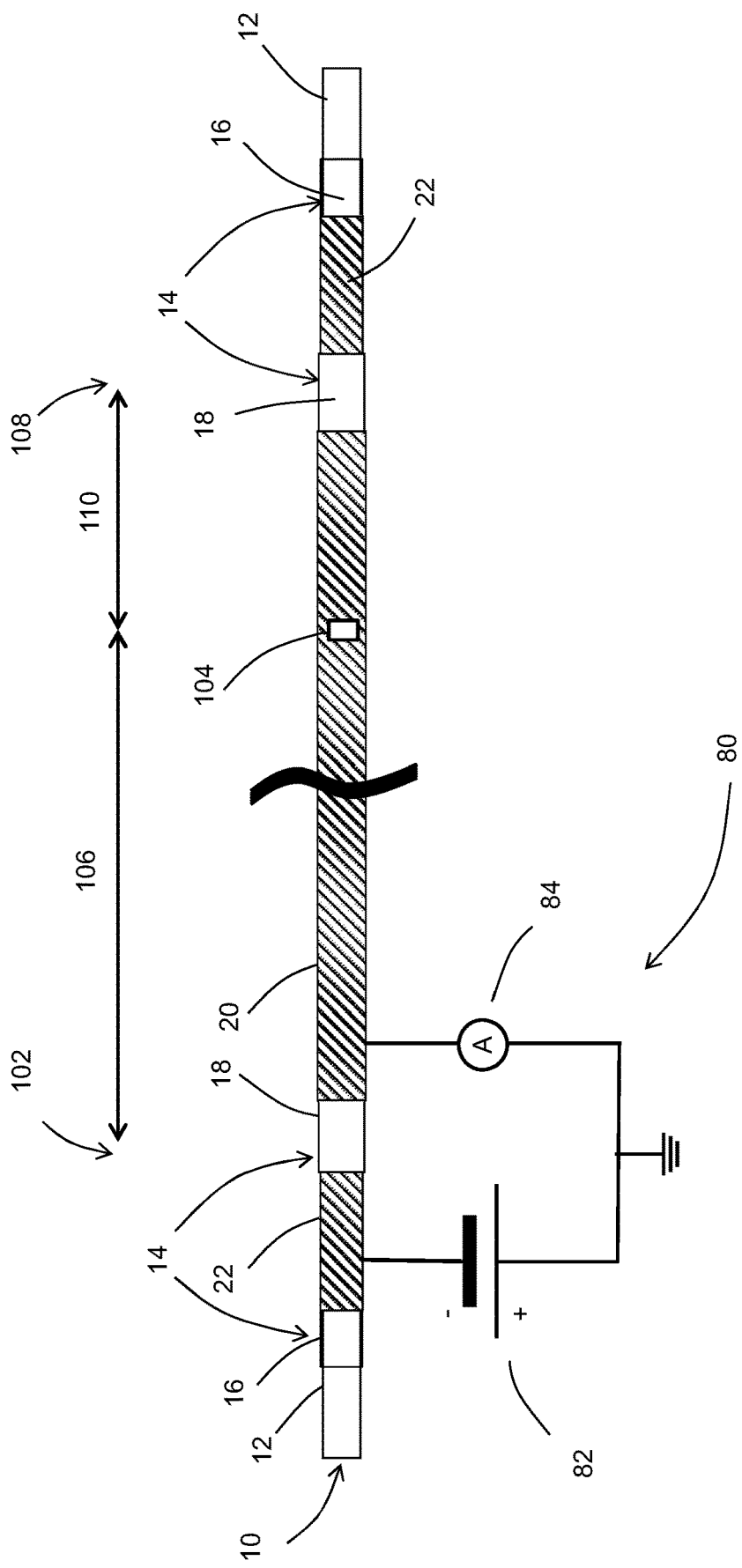
FIG. 5 diagrammatically shows an example of a power cable system and of a jacket integrity testing apparatus and method according to the present disclosure.

With reference to FIG. 5, a jacket integrity testing method according to the present disclosure includes applying, through a voltage source 82 of a testing apparatus 80, a DC voltage across the test semiconducting layer 22 and the outermost semiconducting layer 20, at a first location 102 along a power cable 10.

In case of testing in the manufacturing plant, the first location 102 is an end of power cable 10.

In the case of test on a power cable system, namely after deployment, the first location 102 may be a cable end, such as at a termination or a joint of the power cable system.

Specifically, a DC voltage of negative polarity of 10 kV is applied across the test semiconducting layer 22 and the outermost semiconducting layer 20 by voltage source 82, for a period of 1 min. The testing apparatus 80 may include a controller (not shown) including a timer.

No breakdown between the test semiconducting layer 22 and the outermost semiconducting layer 20 should occur during the test. A breakdown is indicative of a fault or non-integrity 104 in the outer jacket layer 18 causing a current leakage therethrough. The testing apparatus 80 may include conventional means, such as the testing of the voltage at a second location discussed in EP2577683B1, to check whether a breakdown through the test semiconducting layer 22 and the outermost semiconducting layer 20 occurs during the test.

To verify a breakdown condition, the testing method may further include measuring, through an ammeter 84 of the testing apparatus 80, a current flowing across the test semiconducting layer 22 and the outermost semiconducting layer 20 at the first longitudinal end 102.

In case of no fault, there is no circulating current between the two connected semiconducting layers 20, 22, and thus ammeter 84 would read 0 A.

Conversely, in case there is a fault 104 in outer jacket layer 18, there will be a current circulating between the two connected semiconducting layers 20, 22, and the current may be detected by ammeter 84. Accordingly, if the ammeter 84 reading is not null, the jacket integrity test is not passed.

The jacket integrity test may also allow locating the position of non-integrity or fault 104 along power cable 10. It is noted that FIG. 5 is not drawn to scale, so that the double arrow representing distance 106 should only be taken as indicative: in practice, the voltage source 82 and ammeter 84 may be at adjacent operative positions along the cable 10.

The current intensity may be correlated to the distance 106 between the location 102 where the voltage is applied and the location of the fault 104 in the outer jacket layer 18, because it depends on the resistance offered by the length of the semiconducting layers 20, 22 between the two locations. By measuring the current flowing through ammeter 84, an estimate of the distance 102 may accordingly be made.

The test current magnitude may be quite low, in the order of milliamperes (mA), thus the use of a milli-ammeter may be useful as ammeter 84.

The present testing method is economically convenient and requires one technician only.

It is noted that the metallic screen(s) 34 and the conductor (s) 30 are not involved in the jacket integrity test disclosed herein, and they need not be disconnected and de-energized before the test and restored after the test. Thus, the power cable 10 may remain in service during the test.

Because the power cable 10 may remain in service, the testing equipment 80 or part thereof may also be kept connected to the power cable 10, thereby rendering periodical or even continuous testing easily available. Bonding leads such as conductive meshes applied to a stripped region of the test semiconducting layer 22 and/or to the outermost semiconducting layer 20 may remain applied; the testing equipment 80 or part thereof, such as the DC voltage source 82, may also remain connected to those bonding leads, or it will be quickly connected thereto with the suitable safety measures. Further options are disclosed in section "Ongoing monitoring" below.

The longer the distance 106 between the location of the jacket fault 104 and the voltage source 82 of the testing instrument 80 is, the greater the resistance of the semiconducting layers 20, 22 and the lower circulating current in ammeter 84 are. The upper limit of a measure range will thus be set by the ammeter sensitivity. However, the measurement may be repeated at a second end 108 of the power cable 10, opposite the first end 102, thus detecting, from a measured second current, the presence of a fault 104 in the outer jacket layer 18, and possibly estimating a distance 110 between the fault 104 and the second longitudinal end longitudinal end 108.

The Applicant has investigated the influence of the testing voltage on the measurement distance range, and it has concluded that varying the testing voltage does not significantly increase the measurement distance range; a testing voltage of 10 kV DC, similar to the above-mentioned standard IEC 60229:2007, is therefore deemed to be proper.

The Applicant has also investigated the influence of the electrical resistivity of the semiconducting layers 20, 22. It has concluded that a lower resistivity increases the performance of the jacket testing method disclosed herein, in that a higher upper limit of the measurement distance range may be obtained the sensitivity of the ammeter being equal, or, conversely, a cheaper, less sensitive instrument may be used the upper limit of the measurement distance range—and thus the cable length 10—being equal.

In principle, there is no limitation to the cable length for performing the outer jacket integrity test disclosed herein, because if a fault occurs in the outer jacket layer 18 between the two semiconducting layers 20, 22, then a leakage current will flow and can in principle be detected. Only with a full intact jacket 14, there will be no leakage current.

Each of the test semiconducting layer 22 and the outermost semiconducting layer 20 may have any suitable electrical resistivity, as mentioned above.

As previously mentioned, the Applicant has also investigated the influence of the radial position of the test semiconducting layer 22 on the measurement distance range, and it has concluded that it does not affect this remarkably.

Having the test semiconducting layer 22 closer to the outermost semiconducting layer 20 than to the metallic screen(s) 34 (i.e. the thickness of the outer jacket layer 18 is lower than the thickness of the inner jacket layer 16) may improve the measurement distance range. Though in conditions of short circuit such configuration might decrease the voltage across the test semiconducting layer 22, such voltage remains at a safe level also locating the test semiconducting layer 22 essentially midway between the outermost semiconducting layer 20 and the metallic screen(s) 34.

The Applicant has noticed that locating the test semiconducting layer 22 closer to the outermost semiconducting layer 20 than to the metallic screen(s) 34 reduces the voltage across the test semiconducting layer 22 in conditions of lightning. However, the voltage across the test semiconducting layer 22 in conditions of lightning remains at a safe level also locating the test semiconducting layer 22 essentially midway between the outermost semiconducting layer 20 and the metallic screen.

Having the test semiconducting layer 22 essentially midway between the outermost semiconducting layer 20 and the metallic screen(s) 34 (i.e. the thickness of the outer jacket layer 18 is substantially the same of that of the inner jacket layer 16) entails advantages in manufacturing process because neither layer is too thin, and because the cable may be easily and quickly manufactured by a dual passage in a same extrusion station.

Ongoing Monitoring

Figure 6:
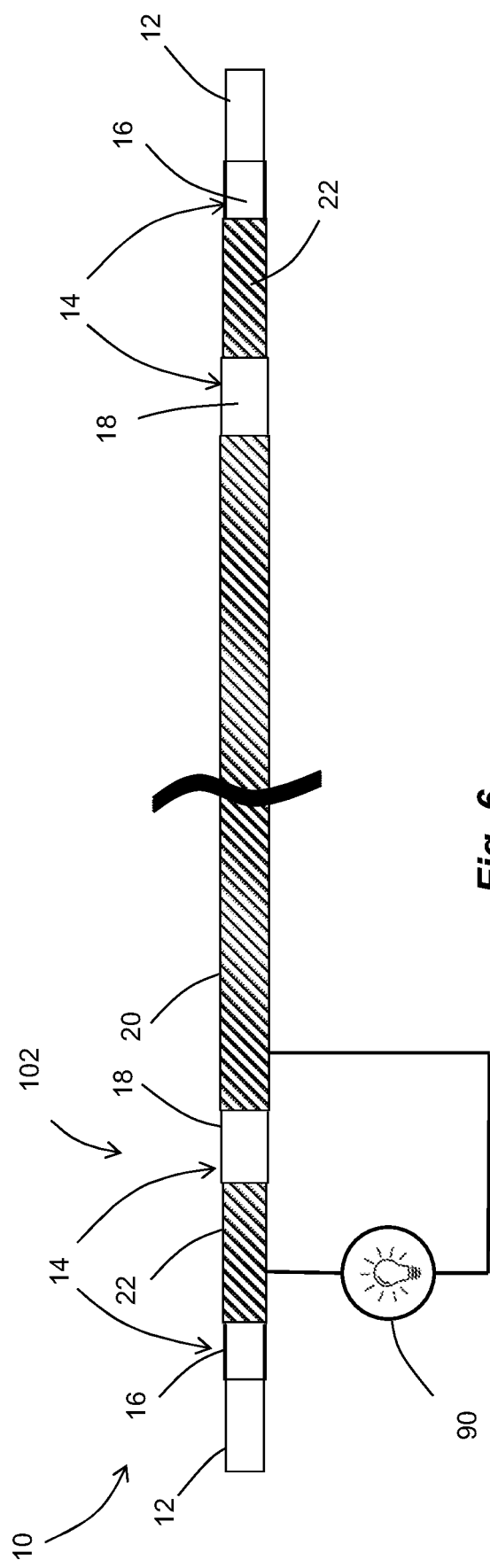
FIGS. 6 and 7 diagrammatically show an example of a power cable system and of an ongoing monitoring apparatus and method according to the present disclosure.
Figure 7:
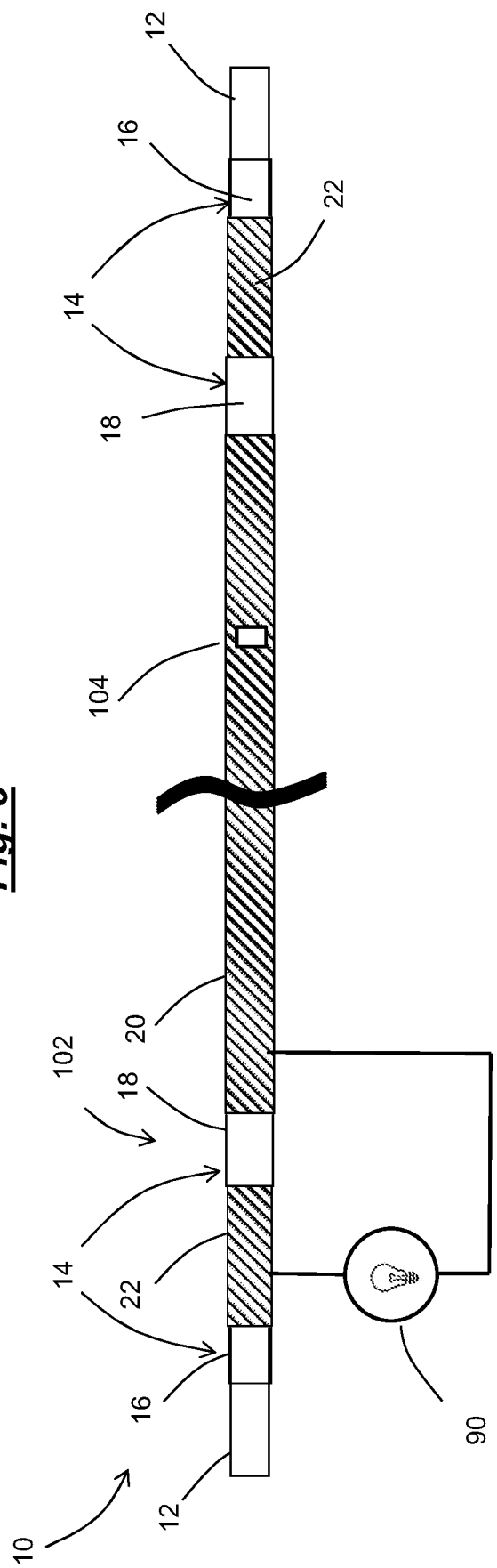

With reference to FIGS. 6 and 7, in order to monitor an energized power cable system, a monitoring tool 90 (herein depicted with a bulb as ideogram) emitting a signal light may be installed between the test semiconducting layer 22 and outermost semiconducting layer 20 of a power cable 10 within a power cable system.

As the test semiconducting layer 22 is unearthed (or connected to earth at one end only), an AC voltage applied to the cable core 12 of the energized power cable 10 will be picked up by this test semiconducting layer 22 because of the capacitive coupling between the metallic screen(s) 34 and the test semiconducting layer 22. Thus, in case of no jacket fault, there would be a voltage across the two semiconducting layers 20, 22, which causes the bulb 90 to also indicate (e.g. by glowing, cf. FIG. 6) that the cable system is energized, which makes the monitoring tool a safety tool as well. Conversely, in case of a jacket fault 104, the bulb 90 will be less bright or completely off, as shown in FIG. 7.

In case of a three-phase cable system, if one of the three bulbs 90 of the cable system is less bright or completely off, this is an indication of a failed jacket in the associated power cable.

The light bulb 90 is just an example of monitoring tool which can be any suitable indicator device. Because of the low intensity of the induced voltage, a light emitter, such as an LED, or an optocoupler might be used as a switch of a powered circuit including any indicator device.

The monitoring tool 90 may be connected to the power cable 10 alternatively to the testing apparatus 80, thus exploiting the same bonding leads, or both can be connected simultaneously to the power cable 10, at a same cable end 102 or at either ends 102, 108.

EXAMPLES

Some specific Examples of power cables are provided below, which are meant to be for a better understanding of the present disclosure only, and may not be construes as limiting examples.

Comparative Example 1

An 87/150 kV cable had a single aluminum conductor sequentially surrounded by an XLPE insulating system and by an aluminum screen in form of a longitudinally welded foil. The overall diameter of the cable core was of about 99.0 mm. The cable core was surrounded and contacted by a polyethylene jacket having a thickness of 4.7 mm, in turn surrounded and contacted by an outermost semiconducting layer made of polyethylene and having a thickness of 0.3 mm.

Example 2

An 87/150 kV cable according to the present disclosure had a single aluminum conductor sequentially surrounded by an XLPE insulating system and by an aluminum screen in form of a longitudinally welded foil. The overall diameter of the cable core was of about 99.0 mm. The cable core was surrounded and contacted by an inner polyethylene jacket layer having a thickness of 1.55 mm, in turn surrounded and contacted by a test semiconducting layer made of polyethylene and having a thickness of 0.15 mm. The test semiconducting layer was surrounded and contacted by an outer polyethylene jacket layer having a thickness of 3.15 mm, in turn surrounded and contacted by an outermost semiconducting layer made of polyethylene and having a thickness of 0.15 mm. The upper limit of the measuring distance range using the above disclosed jacket integrity test was calculated as being well over 3000 m, thus not representing an actual limit in practice.

The cable has been tested under simulated short circuit conditions and under lightning conditions, and it passed both tests.

Example 3

An 87/150 kV cable according to the present disclosure had a single aluminum conductor sequentially surrounded by an XLPE insulating system and by an aluminum screen in form of a longitudinally welded foil. The overall diameter of the cable core was of about 99.0 mm. The cable core was surrounded and contacted by an inner polyethylene jacket layer having a thickness of 3.55 mm, in turn surrounded and contacted by a test semiconducting layer made of polyethylene and having a thickness of 0.15 mm. The test semiconducting layer was surrounded and contacted by an outer polyethylene jacket layer having a thickness of 1.15 mm, in turn surrounded and contacted by an outermost semiconducting layer made of polyethylene and having a thickness of 0.15 mm.

The cable of Example 3 differed from that of Example 2 in the distance of the test semiconducting layer 22 from the metallic screen 34 and from the outermost semiconducting layer 20 (i.e. the cable differed in the thickness of the inner and of the outer jacket layers).

The upper limit of the measuring distance range using the above disclosed jacket integrity test may be calculated as being well over 3000 m, thus not representing an actual limit in practice.

From Examples 2 and 3, it may be concluded that the position of the test semiconducting layer 22 does not affect the measuring distance range in a remarkable manner.

Example 4

An 87/150 kV cable according to the present disclosure had a single aluminum conductor sequentially surrounded by an XLPE insulating system and by an aluminum screen in form of a longitudinally welded foil. The overall diameter of the cable core was of about 66.2 mm. The cable core was surrounded and contacted by an inner polyethylene jacket layer having a thickness of 2.2 mm, in turn surrounded and contacted by a test semiconducting layer made of polyethylene and having a thickness of 0.3 mm. The test semiconducting layer was surrounded and contacted by an outer polyethylene jacket layer having a thickness of 2.2 mm, in turn surrounded and contacted by an outermost semiconducting layer made of polyethylene and having a thickness of 0.3 mm.

The test semiconducting layer 22 has been placed midway between the outermost semiconducting layer 20 and the metallic screen 34 (i.e. the thickness of the inner jacket layer was the same of that of the outer jacket layer).

Example 5

A power cable system comprising three cables according to Example 2 was virtually evaluated as laid in an existing power circuit between Rotterdam Marconistraat and Rotterdam Centrum. One of the cables had an integrated sensing optical fiber. The total circuit length was of approximately 3.2 km. It consisted of three minor sections:
Minor Section I of length 893 m
Minor Section II of length 1515 m
Minor Section III of length 645 m The main components of the circuit are the cables, one of which with Integrated optical fibre (OF), an earthing cable, outdoor terminations, cross bonding joints with box, 3-phase earthing boxes, polymer manholes and optical fibre termination cabinets. In particular, at each cross bonding, there are cross bonding boxes for cross connecting the three metallic screens; at the outdoor terminations at two ends, there are three-phase earthing boxes for earthing the metallic screens, as well as optical fibre cabinets.

According to the simulation, the cable system passed the jacket integrity test.

The cable system has also undergone virtual transient studies, being tested under conditions simulating a short circuit condition, as well as under conditions simulating a lightning. Performance of the cable system has been deemed fully acceptable.

Manufacturing Method

The cable 10 may be manufactured in several ways.

For example, a manufacturing method involves forming a cable core 12 in any conventional manner and advancing the cable core 12 through an extrusion station. Extrusion of the various layers for the inner jacket layer 16, the test semiconducting layer 22, the outer jacket layer 18 and the outermost semiconducting layer 20 follows.

In particular, the cable 10 may be manufactured by including a multiple pass in a same extruding station just adjusting the extruding tools, for example the die, to conform to the increasing diameter of the semi-finished product, after the cable core 12 has been formed in any suitable manner. In a first pass, the inner jacket layer 16 and the test semiconducting layer 22 are applied over the cable core 12, for example over its metallic screen 34. The two layers can be coextruded.

In a subsequent pass, the outer jacket layer 18 and the outermost semiconducting layer 20 are applied over the test semiconducting layer 22. The two layers may also be coextruded.

This avoids the need and cost of retrofitting a manufacturing plant with insertion of a second extrusion station.

The power cable 10 undergoes control tests during and after manufacturing, including the jacket integrity test disclosed herein in order to find any defects of the jacket. In particular, the jacket integrity test may be performed twice: between the metallic screen 34 and the test semiconducting layer 22 and, thereafter, between the test semiconducting layer 22 and the outermost semiconducting layer 20.

The invention claimed is:

1. A power cable comprising:
a cable core, comprising at least one conductor, an insulating system thereof, and at least one metallic screen,
a jacket surrounding the cable core, comprising an inner jacket layer and an outer jacket layer, and
an outermost semiconducting layer surrounding the outer jacket layer and in direct contact thereto,
characterized by further comprising a test semiconducting layer radially external to the inner jacket layer, and radially internal to the outer jacket layer and directly contacting the inner jacket layer and the outer jacket layer.

2. The power cable according to claim 1, wherein the outermost semiconducting layer is coextruded with the outer jacket layer and/or the test semiconducting layer is coextruded with the inner jacket layer.

3. The power cable according to claim 1, wherein the inner jacket layer and the outer jacket layer have substantially the same thickness.

4. The power cable according to claim 3, wherein each of the test semiconducting layer and the outermost semiconducting layer has a resistivity value lower than 10 Ohm·m.

5. A power cable system comprising at least one power cable according to claim 1, and bonding leads at either or both ends of said power cable configured for electrically connecting the test semiconducting layer and the outermost semiconducting layer to a jacket integrity testing apparatus.

6. The power cable system according to claim 5, further comprising a monitoring apparatus connected across the test semiconducting layer and the outermost semiconducting layer of the power cable at a first longitudinal end thereof while the power cable is energized.

7. The power cable system according to claim 5, further comprising the jacket integrity testing apparatus connected to the power cable.

8. The power cable system according to claim 7, wherein the jacket integrity testing apparatus comprises a voltage source connected across the test semiconducting layer and the outermost semiconducting layer of the power cable at a first longitudinal end thereof, and an ammeter connected across the test semiconducting layer and the outermost semiconducting layer of the power cable.

9. A method for jacket integrity testing of a power cable system comprising at least one power cable according to claim 1, the method comprising:

applying a testing DC voltage of a preset magnitude across the test semiconducting layer and the outermost semiconducting layer of the power cable at a first longitudinal end thereof, measuring a current flowing across the test semiconducting layer and the outermost semiconducting layer at the first longitudinal end, and detecting, from the measured current, a presence of a fault in the cable outer jacket layer.

10. The method according to claim 9, further comprising measuring a second current flowing across the test semiconducting layer and the outermost semiconducting layer at a second longitudinal end opposite the first longitudinal end, and detecting, from the measured second current, the presence of the fault in the outer jacket layer.

11. The method according to claim 9 further comprising the step of estimating a distance between the fault and the first longitudinal end and/or a second longitudinal end opposite the first longitudinal end.

12. The method according to claim 10 further comprising the step of estimating a distance between the fault and the first longitudinal end and/or the second longitudinal end.

* * * * *